United States Patent [19]

Grant et al.

[11] Patent Number: 4,472,728
[45] Date of Patent: Sep. 18, 1984

[54] IMAGING X-RAY SPECTROMETER

[75] Inventors: Patrick A. Grant, Orem, Utah; John W. Jackson, Jr., Mt. Rainer, Md.; George E. Alcorn, Reston, Va.; Francis E. Marshall, Lanham, Md.

[73] Assignee: The United States of America as represented by the Administrator of the National Aeronautics and Space Administration, Washington, D.C.

[21] Appl. No.: 350,477

[22] Filed: Feb. 19, 1982

[51] Int. Cl.³ .......................................... H01L 27/14
[52] U.S. Cl. ..................................... 357/30; 357/29; 357/32; 250/385; 250/367; 250/483.1
[58] Field of Search ................. 357/30, 30 D, 30 H, 357/29, 32; 250/385, 367, 483.1

[56] References Cited

U.S. PATENT DOCUMENTS

| | | | |
|---|---|---|---|
| Re. 27,879 | 1/1974 | Collins et al. | 357/30 X |
| 3,529,161 | 9/1970 | Oosthoek et al. | 357/30 X |
| 3,801,884 | 4/1974 | Sequin | 357/30 X |
| 3,930,162 | 12/1975 | Reiss | 250/385 |
| 4,010,534 | 3/1977 | Anthony et al. | 29/572 |
| 4,030,116 | 6/1977 | Blumenfeld | 357/32 |
| 4,153,908 | 5/1979 | Meyer | 357/32 |
| 4,179,608 | 12/1979 | Walenta | 350/385 |
| 4,210,805 | 7/1980 | Kobayashi et al. | 250/370 |

OTHER PUBLICATIONS

Multichannel Semiconductor Detectors for High Energy X-ray and Electron Beams, Y. Naruse, 2107 Nuclear Instr. & Methods, vol. 196, (May 1982), No. 1, Amsterdam, Netherlands.
Direct Soft X-ray Response of a Charge-coupled Image Sensor, L. N. Koppel, Rev. Sci. Instrum., vol. 48, No. 6, (Jun. 1977).
Optical Spectra, New Products, "Scan with X-rays," p. 77, May 1980.
Science News, Technology, "With an eye for dissolving metal", p. 217, Oct. 9, 1980.

Primary Examiner—Martin H. Edlow
Assistant Examiner—William A. Mintel
Attorney, Agent, or Firm—John O. Tresansky; John R. Manning; Sol Sheinbein

[57] ABSTRACT

An X-ray spectrometer for providing imaging and energy resolution of an X-ray source comprised of a thick silicon wafer (10) having an embedded matrix or grid of aluminum completely through the wafer fabricated, for example, by thermal migration. The aluminum matrix defines the walls (16, 18) of a rectangular array of silicon X-ray detector cells (14) or "pixels". A thermally diffused aluminum electrode (20) is also formed centrally through each of the silicon cells (14) with biasing means (22, 26, 28) being connected to the aluminum cell walls (16, 18) and the centralized aluminum electrode (20) for causing lateral charge carrier depletion between the cell walls so that incident X-ray energy causes a photo-electric reaction within the silicon producing collectible charge carriers in the form of electrons which are collected and used for imaging.

11 Claims, 2 Drawing Figures

IMAGING X-RAY SPECTROMETER

ORIGIN OF THE INVENTION

The invention described herein was made by employees of the U.S. Government and may be manufactured and used by or for the Government for governmental purposes without the payment of any royalties thereon or therefor.

TECHNICAL FIELD

The invention relates generally to electromagnetic radiation detectors and, more particularly, to solid state X-ray spectrometers for providing imaging and energy resolution of an X-ray source.

BACKGROUND ART

Known instrumentation for providing analysis of electromagnetic radiation X-ray sources typically utilize either silicon charge coupled devices (CCD) or lithium drift detectors. Silicon CCD's offer imaging and energy resolution, but only for energies less than 1 Kev. A depletion region, i.e. a region where there are no free holes present to decrease electron current formed by X-rays, is required to prevent recombination of X-ray freed electrons before they are collected. These depletion regions are relatively shallow, being in the order of 5 micrometers for silicon, due to the limited internal voltages inherent in CCD devices. Also, depletion occurs in a direction parallel to the incident X-ray energy. Whereas only a few microns of silicon are depleted, a relatively large thickness of silicon is nevertheless required to stop and detect X-rays in the 1 to 30 Kev range. As a result, inefficient and inaccurate detection occurs with CCD's because they cannot provide depletion of a large enough volume of silicon to assure that the photo-electric effect occurs in the silicon thickness provided for X-rays greater than 1 Kev. This failing is even more pronounced for higher energy X-rays because the thickness of silicon required to react with an X-ray varies as the third power of the X-ray energy. Also, a CCD has no focusing properties and its collection efficiency is a function of the solid angle the detector element subtends with the photo-electric interaction region.

While lithium drift detectors have good energy resolution, they exhibit no spatial resolution. Therefore, imaging cannot be performed. Moreover, the best lithium drift detectors are made of silicon or germanium and must be kept at extremely low temperatures (on the order of 100° K.) in order to remain operational. Also, operational voltages of the order of several kilovolts are required.

In summation, current technology provides either high spatial resolution with poor energy resolution or good energy resolution with no spatial resolution.

STATEMENT OF INVENTION

Accordingly, it is an object of the present invention to provide an improvement in electromagnetic radiation detectors.

Another object of the invention is to provide an X-ray spectrometer having a high efficiency over a broad energy band.

Still another object of the invention is to provide an X-ray detector array having improved energy and spatial resolution.

Still a further object of the invention is to provide an X-ray detector system which is adapted to operate with X-ray sources in the 1 to 30 Kev range.

It is yet another object of the invention to provide an imaging spectrometer which is adapted for space applications involving X-ray telescopes.

These and other objects are achieved with an imaging high energy X-ray detector having an array of discrete, adjoining deep-diode cells or "pixels" created in a nearly depleted, thick semiconductor wafer. Each diode has a central, vertically diffused metal electrode extending between opposed wafer surfaces. A rectangular vertical grid of vertically thermally migrated metal forms common walls which separate adjacent pixels. Application of a bias potential across the central electrodes and the rectangular grid causes a depletion region in each pixel extending vertically completely through the wafer and horizontally between the central electrode and the grid walls. Depletion of each pixel is, therefore, independent of wafer thickness, thus assuring high efficiency in photo-charge carrier collection.

The X-ray detector array may be placed in the focal plane of an optic system. Energy and spatial resolution of an X-ray image may be obtained by connecting each central electrode of the detector array to a separate element of a charge coupled device image processor.

The foregoing as well as other objects, features and advantages of the invention will become apparent from the following detailed description when taken in conjunction with the appended drawings.

DETAILED DESCRIPTION OF THE INVENTION

Figure 1:
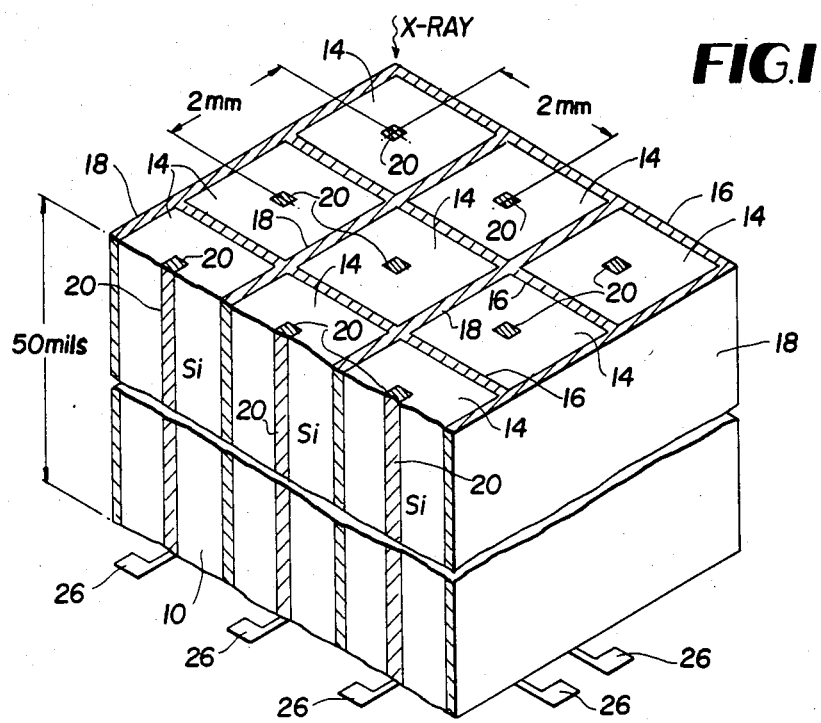
FIG. 1 is a perspective view, partially in section, of an X-ray detector array which is illustrative of an embodiment of the invention.

Referring now to the drawings and, in particular to FIG. 1, an X-ray detector array is made with a relatively thick body 10 of a high resistivity (e.g. ~2000 ohm-centimeters, ~$10^{14}$ donors per $cm^3$) semiconductor material such as a wafer of silicon. The depth of penetration into a semiconductor material by X-rays perpendicularly incident to the illuminated semiconductor surface is proportional to the cube of the incident X-ray energy. The thickness of wafer 10, therefore, should be slightly greater than the anticipated depth of penetration of incident X-rays to assure photo-electron production by the higher energy X-rays. For X-rays in the 1 to 30 kilo-electron volt range, for example, the thickness of wafer 10 should be on the order of 50 mils. Silicon wafer 10 is configured into a rectangular grid or matrix of detector cells (pixels) 14, nine of which are shown, to provide spatial imaging and energy resolution of X-ray images. The grid is formed by perpendicular vertically thermally migrated metal walls 16 and 18 which extend completely through the thickness of wafer 10. The pixels are preferably made identical to one another with generally rectangular cross sections across their horizontal surfaces. Each pixel has a centrally located diffused metal electrode 20 extending between opposite surfaces and completely through the thickness of water 10. The cross sectional dimension of each central electrode 20 is made relatively small in comparison to the cross sectional area of the pixel, thereby minimizing the probability of X-rays impinging directly upon the central electrodes. To enhance spatial resolution of an X-ray image, the horizontal cross sectional area of each cell is also made small with the center-to-center separation between central electrodes of adjoining pixels being on the order of one millimeter. The resulting configuration forms a rectangular grid of X-ray detecting pixels.

Vertical metal walls 16, 18 and central electrodes 20 may be formed by temperature gradient driven diffusion of a metal such as aluminum in silicon or gallium in gallium arsenide in a thermo-migration process. In such a process, openings defining the horizontal surface of walls 16, 18 and electrodes 20 are etched into a layer of photo-resist to form a mask on one surface of wafer 10. The wafer may then be heated in a vacuum chamber to an elevated temperature on the order of 1200° C. for example. The wafer surface opposite the masked surface is maintained at the chamber temperature while the masked surface may be cooled to a slightly lower temperature such as 1150° C. to establish a thermal gradient across the wafer. Metal deposited in the etched mass openings on the cooler surface of the heated wafer is quickly driven by the thermal gradient to diffuse vertically completely through the wafer to the opposite surface. The wafer may be cooled and removed from the chamber. The rapid temperature gradient driven diffusion of the metal through the entire thickness of wafer 10 leaves little time for lateral diffusion. The sides of walls 16, 18 and electrodes 20, therefore, are essentially perpendicular to the horizontal surfaces of wafer 10. Consequently, application of a bias potential across central electrodes 20 and the grid of walls 16, 18 will create a depletion region extending from the central electrode to the adjacent wall of each cell. This configuration assures that incident X-rays impinging upon wafer 10 with a penetration depth less than the thickness of wafer 10 will precipitate a photo-electron interaction with the wafer material. Regardless of where the interaction occurs within a pixel, the resulting photo-electrons will be attracted to the central electrode, thereby providing a basis for detection of the incident X-rays.

The array of detector cells shown in FIG. 1 in effect comprises a "deep diode" array inasmuch as the electrodes formed by the side walls 16 and 18 and the center posts 20 extend completely through the semiconductor material and terminate in opposed surfaces of the wafer 10. What is significant, however, about the array shown in FIG. 1 is that by the application of a forward bias on the cell walls 16 and 18 and a back bias on the center posts 20, depletion (the absence of free holes tending to decrease electron current) takes place laterally between center post and the side walls throughout the entire 50 mil thickness of the wafer perpendicularly to the direction of any X-ray energy incident on the face of the array. This is in contrast to the known prior art devices wherein depletion takes place in a direction parallel to the incident X-ray energy. This is particularly true with respect to CCD X-ray detectors which, as noted above, typically depletes only about 5 μm of silicon with the result being decreased energy resolution and efficiency at high energies.

Figure 2:
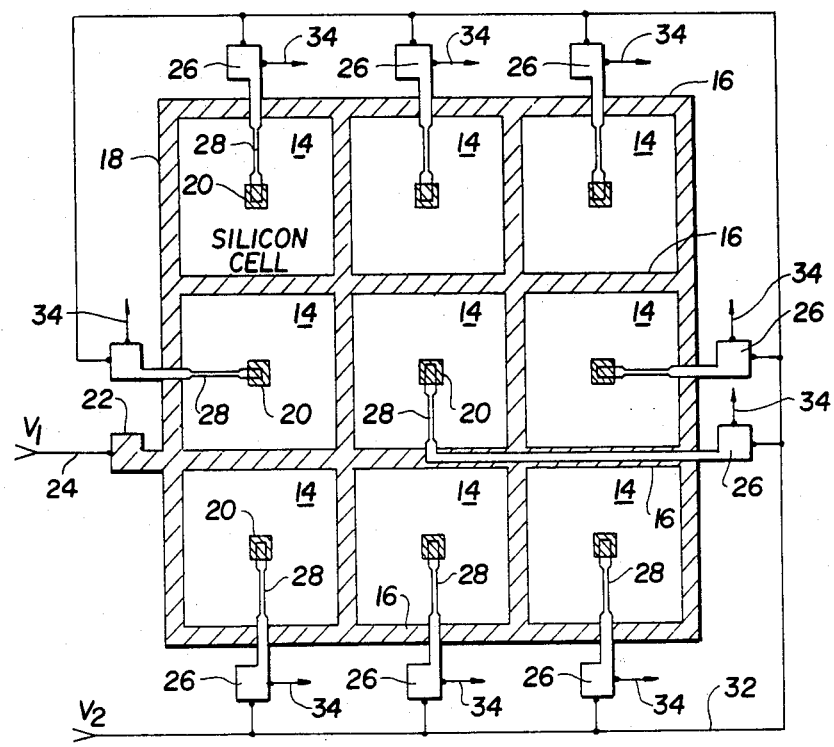
FIG. 2 is a bottom planar view of the embodiment shown in FIG. 1 being illustrative of the matrix of detector cells and the respective external connection means to the centralized inner electrodes.

In order to apply the required bias potentials and to collect electrons from each of the detector cells 14 resulting from X-ray photo-electron interaction initiated in each cell as a result of incident X-ray energy, the array of FIG. 1 includes an arrangement of bonding pads and the metal interconnects which is shown in detail in FIG. 2. Referring now to FIG. 2, the exterior vertical wall 18 on the left side of the array includes rectangular shaped bonding pad 22 to which is secured a circuit lead 24 which is adapted to apply a forward biasing potential $V_1$ to all of the horizontal and vertical side walls 16 and 18 from a source, not shown. Each center post electrode 20 is connected to a respective external bonding pad 26 by being connected to the center electrode by a metallized interconnect element 28 which extends outwardly to one of the side walls 16 or 18. In the case of interior cells, such as the middle cell shown in FIG. 2, interconnect element 28 is extended to the outer perimeter of the cell. A back biasing potential $V_2$ is commonly connected from a source, not shown, to all of the bonding pads 26 by means of a circuit lead 32. In addition to the lead 32 for application of the back biasing potential $V_2$, each bonding pad 26 also has an individual output lead 34 which is adapted to couple the electrons produces as a result of X-ray photo-electron interaction to an external imaging device, not shown.

Higher energy X-rays, in the range where the photo-electric effect is dominant, i.e. between 0.5 and 30 kilo-electron-volts for instance, may be reliably detected with the disclosed semiconductor array because the relatively great thickness of wafer 10 and the nearly unobstructed cross sectional area of each pixel increases the probability of the production of photo-electrons by each incident X-ray within the energy range. The proximity of a central electrode to every point within every pixel assures that upon application of a bias potential, the depletion region will extend throughout every pixel and that photo-electrons will be attracted to and collected by a central electrode, thereby establishing a high collection efficiency. This structure is particularly suitable for use with an image processor such as a charge coupled device because the photo-electrons are collected in the same pixel on which an X-ray impinges. If one surface of the detection array is placed in the focal plane of an optical system such as a telescope and illuminated by an X-ray emitting object, the structure of the array will provide a one-to-one spatial correspondence between the pixel upon which each X-ray impinges and the central electrode of the pixel collecting the resulting photo-electrons. The number of photo-electrons collected is indicative of the energy and intensity of incident X-rays, because the energy of an incident X-ray equals the product of the number of electrons collected and the factor of 3.6 electron-volts per electron. The central electrode of each pixel may be connected to a separate element of a charged coupled device image processor, for example, thereby enabling the image processor to sequentially read each pixel and generate a composite image of an observed object as it appears on the illuminated surface of the detector array. The electron flow from each central electrode would provide to the image processor both spatial and energy resolution of the X-rays from the observed object.

Having thus shown and described what is at present considered to be the preferred embodiment of the invention, all alterations, modifications and changes coming within the spirit and scope of the invention as set forth in the appended claims are meant to be included.

We claim:

1. A detector array for providing imaging and energy resolution, comprising:

a body (10) of semiconductor material having a plurality of embedded interconnected boundaries (16, 18) of metallization extending completely through the body thickness of said semiconductor material and forming a grid to define the walls of an array of discrete detector cells (14), each of said cells having a centralized electrode (20) of metallization formed in said semiconductor material extending completely through said body thickness to provide a deep diode type of array, and means (22, 26, 28) coupled to said boundaries and electrodes for applying bias potentials operative to laterally create depletion regions between said cell walls whereby collectable charge carriers are formed in response to electromagnetic energy impinging thereon.

2. The detector array as defined by claim 1 wherein said means (22, 26, 28) for applying bias potential includes: means (22) for applying a forward bias to said cell walls and means (26, 28) for applying a reverse bias to said centralized electrode in each cell whereby free electrons are produced as a result of X-ray photo-electron interaction with the silicon body (10) and which are collectible in the same cell in which said interaction occurs.

3. The detector array as defined by claim 2 wherein said semiconductor material of said body (10) comprises silicon.

4. The detector array as defined by claim 3 wherein said metallization of said embedded boundaries (16, 18) comprises aluminum.

5. The detector array as defined by claim 4 wherein said embedded boundaries (16, 18) define a generally rectangular matrix of detector cells (14).

6. The detector array as defined by claim 3 wherein said centralized electrode (20) of each cell (14) comprises an aluminum electrode.

7. The detector array as defined by claim 3 wherein said embedded boundaries (16, 18) comprises thermally migrated aluminum cell walls and said centralized electrode (20) in each cell (14) comprises a thermally migrated aluminum electrode.

8. The detector array as defined by claim 3 wherein the body of silicon has a thickness of substantially 50 mils or greater for operating and being responsive to X-ray energy in the 0.5 to 30 Kev range.

9. A semiconductor detector array, comprising:

a wafer (10) of a semiconducting material having a low intrinsic majority charge carrier concentration;

a grid of metal diffused traversely by thermal migration between one pair of opposed surfaces of said semiconductor wafer (10);

said grid having a plurality of intersecting walls (16, 18) extending between and terminating in said opposed surfaces, said walls defining a plurality of discrete cells (14) in said semiconducting material; and a plurality of electrodes (20) spaced apart from said grid of metal diffused traversely between and terminating in said opposed surfaces, each of said electrodes (20) being located in different cells of said cells (14).

10. A semiconductor array as defined in claim 9 further comprising means (22, 26, 28) for applying a forward bias to said grid walls (16, 18) and a reverse bias to said electrodes (20) for providing charge carrier depletion to extend between said opposed surfaces in each of said discrete cells.

11. A semiconductor detector array as comprising:

a wafer (10) of a semiconducting material having a low intrinsic majority charge carrier concentration, wherein said wafer has a thickness of a predetermined dimension which insures photo-electron interaction in the bulk of the silicon for X-ray energy in the range between 0.5 and 30 Kev;

a grid of metal diffused transversely by thermal migration between one pair of opposed surfaces of said semiconducting wafer (10);

said grid having a plurality of intersecting walls (16, 18) extending between and terminating in said opposed surfaces, said walls defining a plurality of discrete cells (14) in said semiconducting material;

a plurality of electrodes (20) spaced apart from said grid of metal diffused transversely between and terminating in said opposed surfaces, each of said electrodes (20) being located in different cells of said cells (14); and means (22, 26, 28) for applying a forward bias to said grid walls (16, 18) and a reverse bias to said electrodes (20) for providing charge carrier depletion to extend between said opposed surfaces in each of said discrete cells.

* * * * *